(12) United States Patent
Alley et al.

(10) Patent No.: US 7,444,347 B1
(45) Date of Patent: Oct. 28, 2008

(54) SYSTEMS, METHODS AND COMPUTER PRODUCTS FOR COMPRESSION OF HIERARCHICAL IDENTIFIERS

(75) Inventors: Charles L. Alley, Durham, NC (US); Anthony J Bybell, Carrboro, NC (US); Mudit H. Mehta, Waltham, MA (US); Jason M. Sullivan, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/941,376

(22) Filed: Nov. 16, 2007

(51) Int. Cl.
G06F 17/30 (2006.01)
G06F 7/00 (2006.01)

(52) U.S. Cl. .......................... 707/101; 707/102; 707/6; 707/7

(58) Field of Classification Search ................. 707/101, 707/102, 6, 7
See application file for complete search history.

(56) References Cited

U.S. PATENT DOCUMENTS

| | | | | |
|---|---|---|---|---|
| 4,843,389 | A * | 6/1989 | Lisle et al. | 341/106 |
| 5,325,091 | A * | 6/1994 | Kaplan et al. | 341/51 |
| 6,557,054 | B2 | 4/2003 | Reisman | |
| 7,165,023 | B2 * | 1/2007 | Corman et al. | 704/9 |
| 7,171,618 | B2 * | 1/2007 | Harrington et al. | 715/229 |
| 7,178,100 | B2 * | 2/2007 | Call | 715/210 |
| 2002/0006164 | A1 * | 1/2002 | Felts | 375/240.19 |
| 2003/0191719 | A1 | 10/2003 | Ginter et al. | |
| 2004/0117740 | A1 * | 6/2004 | Chen et al. | 715/531 |
| 2005/0157217 | A1 * | 7/2005 | Hendricks | 348/734 |
| 2005/0198070 | A1 * | 9/2005 | Lowry | 707/104.1 |
| 2005/0216421 | A1 * | 9/2005 | Barry et al. | 705/64 |
| 2005/0261891 | A1 * | 11/2005 | Chan et al. | 704/9 |
| 2007/0044010 | A1 * | 2/2007 | Sull et al. | 715/500.1 |
| 2007/0128899 | A1 * | 6/2007 | Mayer | 439/152 |

FOREIGN PATENT DOCUMENTS

WO WO0135216 5/2001

OTHER PUBLICATIONS

Naming Issues in the Design of Transparently Distributed Operating Systems, 1987, Robert J. Stroud, ((Item 1 from file 35) 1010738 Order No. AADDX-80202)) [online]; [retrieved on Oct. 26, 2007]; retrieved from the Internet <URL http://www.dialogweb.com/dgi/dwclient.

ModelSim EE/PLUS Reference Manual, The ModelSim Elite Edition for VHDL, Verilog, and Mixed-HDL Simulation, Software Version 5.2, (Modern Technology, Inc.) Oct. 1998, [online], [retrieved on Nov. 2, 2007]; Retrieved from the Internet <URL: <http://courses.ece3.uiuc.edu/ece412/References/modelsim/ee_manual_52.pdf>.

* cited by examiner

Primary Examiner—Kuen S Lu
(74) Attorney, Agent, or Firm—Cantor Colburn LLP; Josh Cockburn

(57) ABSTRACT

Management of hierarchical identifiers in simulation models and netlists is accomplished using a prefix compressor algorithm running on a general purpose computer processor. Full name compression is accomplished when hierarchy data and remainder data are split off and prefix compressed. Compressing prefixes of names in the hierarchy list is performed by comparing a previous entry to a current entry. Compressing prefixes of names in the name list is performed by running an output of compressing of prefixes of names in the hierarchy list and running an output of the compressing of prefixes of names in the name list through a standard compressor software application package. Decompressing of names uses sub operations inverse to the prefix compressor algorithm. The decompressing sub operations create a string pointed to by the prefix pointer and concatenated onto the string pointed to by the name pointer; and thus a full name is created.

4 Claims, 2 Drawing Sheets

SYSTEMS, METHODS AND COMPUTER PRODUCTS FOR COMPRESSION OF HIERARCHICAL IDENTIFIERS

TRADEMARKS

IBM® is a registered trademark of the International Business Machines Corporation, Armonk, N.Y., U.S.A. Other names used herein may be trademarks and registered trademarks, or trade or product names of International Business Machines Corporation or other companies.

TECHNICAL FIELD

This invention relates generally to networked computer system administration and management, software services, application solutions and data replication management directed to data handling programs, such as event monitoring in software management applications, data mining, pattern recognition, data analysis, data transcoding and data conversion operating in various operating system environments including UNIX operating systems, as well as implementations in hardware directed to keeping memory small. More particularly, this invention relates to storage management of hierarchical identifiers in simulation models and netlists, in data compression and decompression applications. This invention can be applied to any system running any service provider application and/or operating system.

BACKGROUND

Known general purpose algorithms such as zip/gzip are used for reducing large storage requirements for large models and netlists. In general, for large models and netlists, the storage requirements are concomitantly large and the compression and decompression operations perform very slowly.

Therefore, the need exists for methods and systems that reduce the storage requirements and increase performance speeds for large models and netlists compression and decompression operations. In addition, the need exists for improving the compressibility of data.

SUMMARY OF THE INVENTION

A method of storage management of hierarchical identifiers in simulation models and netlists is accomplished using a prefix compressor algorithm running on a general purpose computer processor executing computer executable program code that causes the general purpose computer processor to reduce storage requirements. Full names are split into a hierarchy part and a remainder part. The hierarchy data that is split off is prefix compressed then fed to a general purpose computer processor compressor. In addition, the remainder data that is split off is prefix compressed and also fed to a general purpose computer processor compressor. Keeping the hierarchy and remainder parts separate improves the compressibility of the data. The method includes compressing names by performing sub operations of sorting names in lexical order, then splitting full names into a hierarchy list and a remainder list, where any duplicate entries are not allowed to be emitted to the hierarchy list. Next, when a full name's hierarchy changes from a preceding name, a flag is emitted to a name list indicating that a next element in the hierarchy list is to be used. Compressing prefixes of names in the hierarchy list is performed by comparing a previous entry to a current entry, where a value is emitted indicating the number of equal bytes (k) at the beginning of a string and emitting a remaining string starting at the string beginning at +k bytes. Compressing prefixes of names in the name list is performed by running an output of compressing of prefixes of names in the hierarchy list and running an output of the compressing of prefixes of names in the name list through a standard compressor software application package, where the standard compressor software application package includes bzip2, which produces a compressed hierarchy list in conjunction with operations compressing prefixes of names in a name list. In the exemplary embodiment, decompressing of names uses the inverse of the prefix compressor algorithm and is performed by running the compressed hierarchy list and the name list through a standard decompressor software application package, and where the standard decompressor software application package includes bzip2, then the sub operations of reading a value at a start of an entry; copying a quantity of bytes from a preceding entry; and appending a string that follows; then setting a pointer at a beginning of the prefix list and setting a pointer at a beginning of the name list. This operation is followed by stepping through the name entries one by one until no names exist, when the flag emitted when a full name's hierarchy changes from the preceding name is encountered, then this flag is used to indicate that the prefix pointer is moved forward by one entry for the next element in the hierarchy list. These operations create a string pointed to by the prefix pointer and concatenated on to the string pointed to by the name pointer; and thus a full name is created.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings, which are meant to be exemplary, and not limiting, wherein:

DETAILED DESCRIPTION

The disclosed exemplary embodiments are intended to be illustrative only, since numerous modifications and variations therein will be apparent to those of ordinary skill in the art. In reference to the drawings, like numbers will indicate like parts continuously throughout the view. Further, the terms "a", "an", "first", "second" and "third" herein do not denote limitations of quantity, but rather denote the presence of one or more of the referenced item(s).

Figure 1:
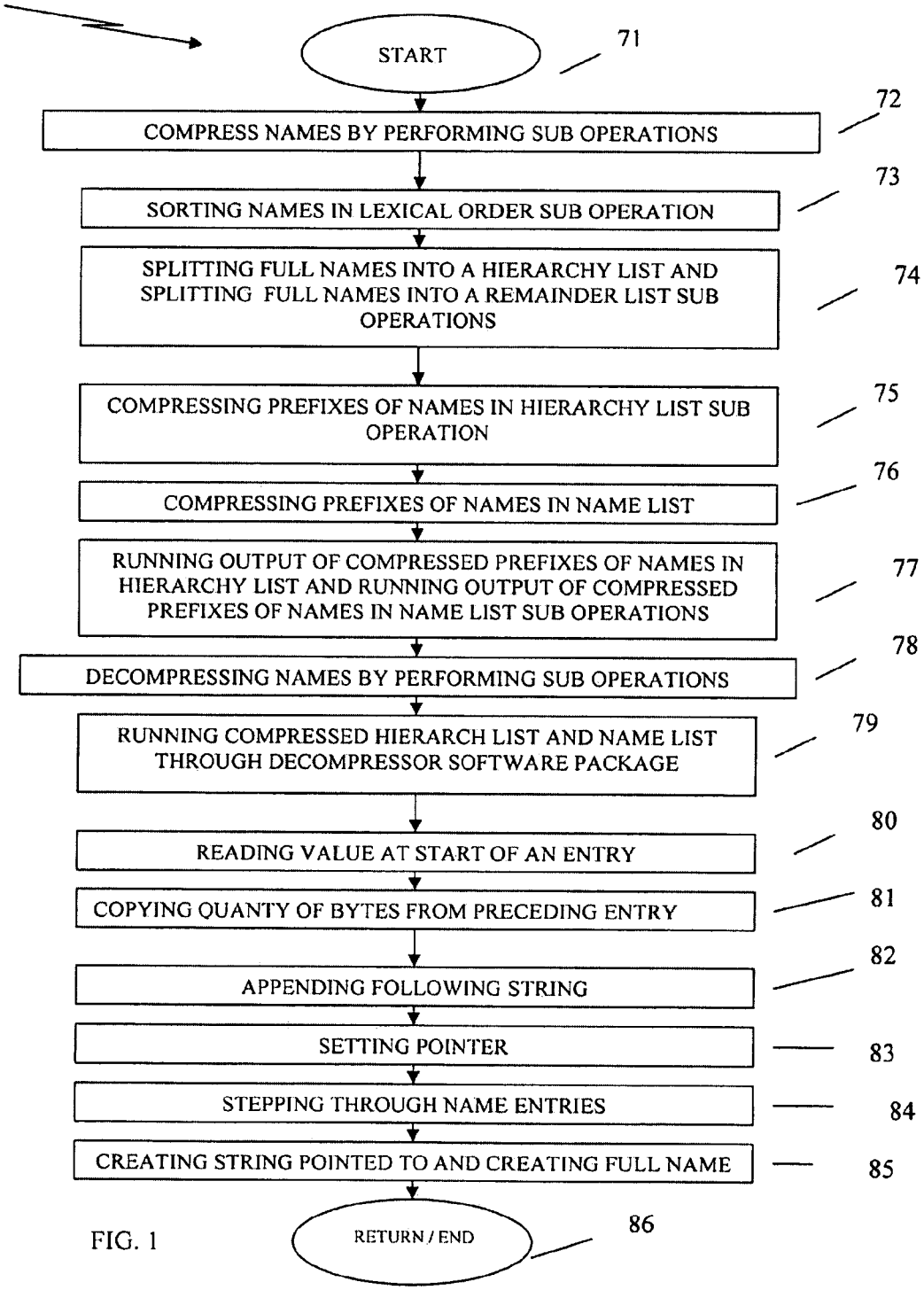
FIG. 1 illustrates operations of the method of storage management of hierarchical identifiers.
Figure 2:
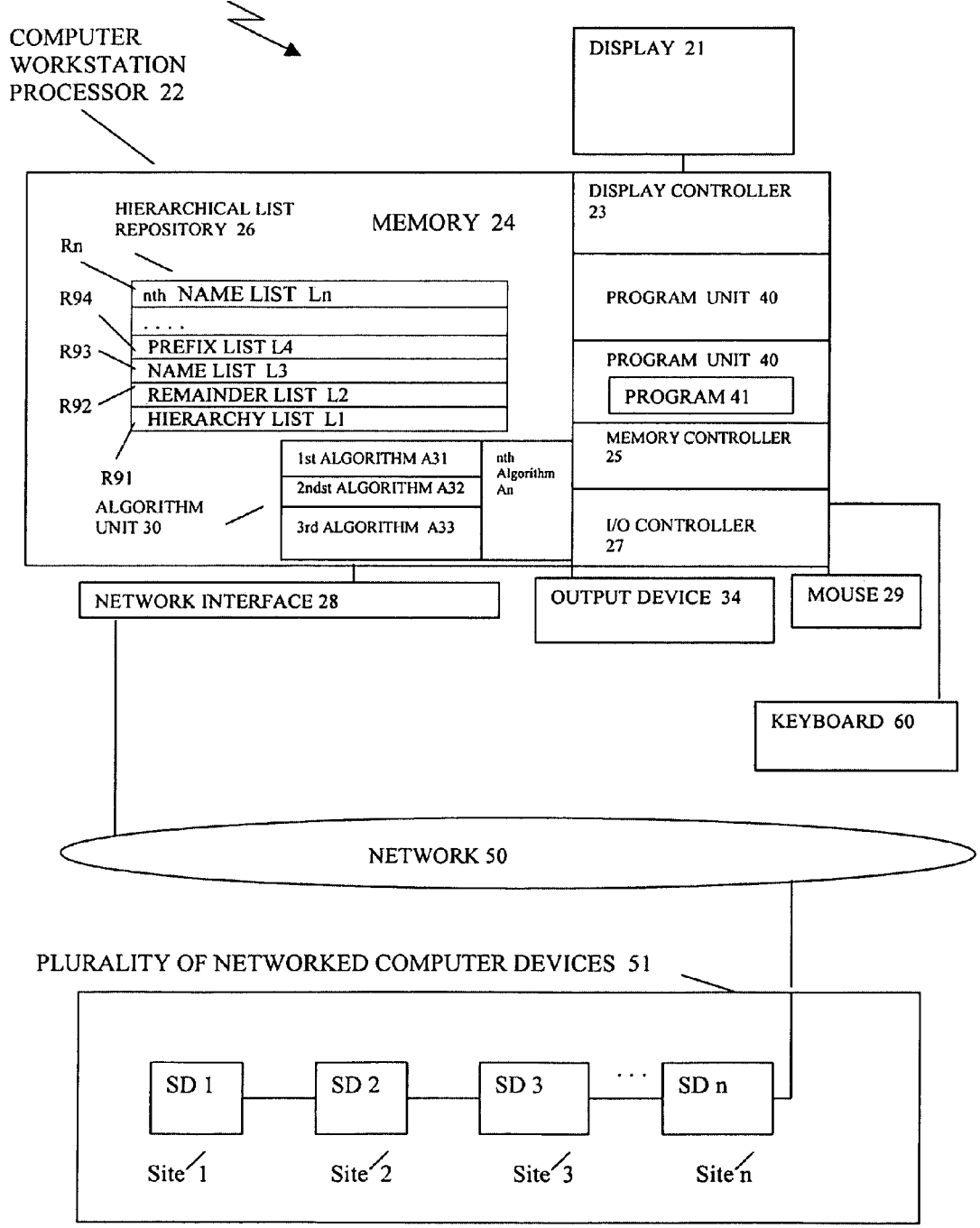
FIG. 2 illustrates the system implementing operations of the method illustrated in FIG. 1.

A compression of hierarchical identifiers method 70 (herein referred to as "method 70") and a compression of hierarchical identifiers system 20 (herein referred to as "system 20") for storage management of hierarchical identifiers in simulation models and netlists using a prefix compressor algorithm running on a general purpose computer processor executing computer executable program code that causes the general purpose computer processor to reduce storage requirements are illustrated in FIGS. 1 and 2 respectively.

Referring to FIG. 2, system 20 includes computer workstation processor 22, which contains memory 24. Algorithm unit 30 resides in memory 24 and contains a plurality of algorithms including first algorithm A31, second algorithm A32 and third algorithm A33 up to nth algorithm An. Also, residing in system 20 is program unit 40, containing program 41. Memory 24 also contains a hierarchical list repository 26, which contains a plurality of repository entry locations R91, R92, R93, R94 and up to Rn, which hold and/or store a plurality of hierarchy lists, remainder lists, name lists and prefix list L1, L2, L3 and L4 respectively up to nth NAME LIST Ln.

In the exemplary embodiment, system 20 includes a combination of controllers including display controller 23, memory controller 25 and input/output (I/O) controller 27 and a combination of computer peripheral devices communicatively coupled to system 20 including display 21, a set of input devices including keyboard 60 and mouse 29, network interface 28, and output device 34, via standard interface connectivity. Network interface 28 cooperatively couples computer workstation processor 22 via network 50 (where network 50 can be a wide area network such as the Internet or a local area network, including an intranet or an extranet) to a plurality of networked computer devices 51. The plurality of networked computer devices 51 includes a plurality of storage devices represented as SD 1, SD 2, SD 3 up to SD n, associated with a plurality of sites, including site 1, site 2, site 3 up to site n, as illustrated in FIG. 2. In the exemplary embodiment SD 1 is a networked storage device associated with one of the networked computer devices of the plurality of networked computer devices 51 and SD 1 is physically and/or logically located and/or connected at site 1. SD 2 is another networked storage device associated with the plurality of networked computer devices 51 and SD 2 is located and/or logically connected at site 2; SD 3 is a third associated with the plurality of networked computer devices 51 and SD 3 is located and/or logically connected at site 3. SD n is an nth storage device and is associated with site n.

Referring to FIG. 2, display 21 displays indications of the progress, state and/or status of storage management operations of hierarchical identifiers in simulation models and netlists. In the exemplary embodiment display 21 can display administration and management solutions directed to data handling programs, including event monitoring in software management applications and data handling programs, directed to different site locations.

Referring to FIG. 1 and FIG. 2, at operation start 71 of method 70, system 20 receives a signal from an operator/user input device including mouse 29 or keyboard 60, which activates and initiates program 41, where method 70 is stored as executable program code on a computer executable medium. Once activated, program 41 performs other selections in method 70 from selection signals received from keyboard 60 or mouse 29; causing program 41 to be executed by computer workstation processor 22 to perform the operations of method 70, thereby calling first algorithm A31, second algorithm A32, a third algorithm A33 up to nth algorithm An to perform operations and sub operations of method 70 of storage management of hierarchical identifiers in simulation models and netlists using compression and decompression algorithms. In the exemplary embodiment, the first algorithm A31 is a compression algorithm; the second algorithm A32 is a decompression algorithm; the third algorithm A33 is a prefix compressor algorithm. Therefore, any number of compression/decompression solutions can be dynamically generated when operators/users want to view images of their data management solution states. Thus, at start 71 the method is initiated for storage management of hierarchical identifiers in simulation models and netlists using a general purpose computer processor including computer workstation processor 22 to reduce storage requirements.

Referring to FIGS. 1 and 2, at operation 72, program 41, executed by system 20, and calling first algorithm A31 (the compression algorithm) causes system 20 to perform the operation of compressing names by performing the following sub operations: At sub operation 73, program 41 executing method 70 causes system 20 to sort names in lexical order, where sorting is done by looking at the lexical order of the first character in each item, then the second character until each character is reviewed. At sub operation 74, program 41 executing method 70 causes system 20 to split full names into a hierarchy list L1 and a remainder list L2, where duplicate entries are not emitted to the hierarchy list L1, and where a flag is emitted to a name list L3 indicating that a next element in the hierarchy list L1 is used, when a full name's hierarchy changes from a preceding name. At sub operation 75, program 41 executing method 70 causes system 20 to compress prefixes of names in the hierarchy list L1, where compressing prefixes is performed by comparing a previous entry to a current entry, where a value is emitted indicating the number of equal bytes (k) at the beginning of the string and emitting the remaining string starting at a string beginning at +k bytes. At sub operation 76, program 41 calls third algorithm A33 (the prefix compressor algorithm) to compress prefixes of names in the name list L3, where the name list L3 is accessed from the repository entry location R93 in the hierarchical list repository 26. At sub operation 77, program 41 calls another algorithm from the plurality of algorithms in algorithm unit 30 and causes system 20 to run an output of compressing prefixes of names in the hierarchy list L1 and run an out put of compressing prefixes of names in the name list L2, where the another algorithm contains a standard compressor software application package including bzip2, which produces a hierarchy list L1 that is compressed and name list L3.

Referring to FIGS. 1 and 2, at operation 78, program 41, executed by system 20, and calling the second algorithm A32 (the decompression algorithm, where the decompression algorithm uses the inverse of third algorithm A33, and has a standard decompressor software application package including bzip2, i.e., the prefix compressor algorithm) causes system 20 to perform the operation of decompressing names, by performing the following sub operations: At sub operation 79, program 41, calling an other algorithm from the plurality of algorithms residing in algorithm unit 30, causes system 20 to run the hierarchy list L1 which is compressed in operation 72 and run the name list L3 from operation 76, through a standard decompressor software package. At sub operation 80, program 41 calling an other algorithm from the plurality of algorithms from algorithm unit 30 causing system 20 to read a value at a start of an entry. At sub operation 81, program 41 causes system 20 to copy a quantity of bytes from a preceding entry. At sub operation 82, program 41 causes system 20 to append a string that follows. At sub operation 83, program 41 causes system 20 to set a pointer at a beginning of a prefix list L4 and further causes system 20 to set a pointer at a beginning of the name list L2. At sub operation 84, program 41 causes system 20 to step through the name entries one by one until no names exist, wherein when the flag emitted (i.e., the flag for the name list L2 when the full name's hierarchy changes from the preceding name) is encountered, this flag indicates that the prefix pointer is moved forward by one entry for the next element in the hierarchy list L1. At sub operation 85, program 41 causes system 20 to create a string pointed to by the prefix pointer and concatenate onto the string pointed to by the name pointer and create the full name. Thus, full name compression and decompression is effected and can be provided over the network 50 to any of the storage devices SD1, SD2, SD3 up to SDn of the plurality of networked computer devices 51. In regard to memory access, for some applications, keeping the hierarchies and names prefix compressed in memory may prove advantageous for large models as the speed of decompression is offset by the delay incurred by translation misses and page faults due to the smaller size of the prefix compressed data as compared to the expanded data. This depends on the access pattern of the data.

At operation return/end 86, method 70 can be directed by program 41 to return to any of the above operations and/or sub operations to continue iteratively processing and performing said operations and sub operations for a plurality of compression/decompression solutions, or program 41 can direct method 70 to end.

The following Tables provide examples of compressability using the above algorithms, operations and sub operations of the exemplary embodiment of method 20:

TABLE 1 proc netlist

[for the following "+ bz2" indicates the size of that specific data if compressed directly with standard file compressor bzip2.]:
flattened name size: 114536886 bytes ( + bz2 = 2484974)number of names: 1376109levels of hierarchy: 431771
prefix compressed: 7619002 ( + bz2 = 369098)
hier split: 34760857 ( + bz2 = 800145)name split: 9091544 ( + bz2 = 322236)
    hier prefix compressed: 2320351 ( + bz2 = 127161)name prefix compressed: 6827041 (+ bz2 = 160695)(*) compressed to 287856 (397x, 0.21 bytes/name)

TABLE 2

3 way processor RTL model flattened name size: 20114828 ( + bz2 = 857610)number of names: 320457levels of hierarchy: 38978
prefix compressed: 2832756 ( + bz2 = 349559)
hier split: 2609205 ( + bz2 = 90601)name split: 3906283 ( + bz2 = 443489)
    hier prefix compressed: 265012 ( + bz2 = 18786)name prefix compressed: 2707349 (+ bz2 = 267731)(*) compressed to 286517 (70x, 0.89 bytes/name)

TABLE 3

Trace logic RTL model flattened name size: 1381816 ( + bz2 = 43269)number of names: 23181levels of hierarchy: 3932
prefix compressed: 159007 ( + bz2 = 11536)
hier split: 273670 ( + bz2 = 6151)name split: 200315 ( + bz2 = 11474)
hier prefix compressed: 32494 ( + bz2 = 2023)name prefix compressed: 136959 ( + bz2 = 7447)(*) compressed to 9470 (145x, 0.41 bytes/name)

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A method of storage management of hierarchical identifiers in simulation models and netlists using a general purpose computer processor executing computer executable program code that causes the general purpose computer processor to reduce storage requirements, the method comprising:

compressing names by using an algorithm of a plurality of algorithms stored in an algorithm unit of the general purpose computer processor that when executed causes the general purpose computer processor to perform sub operations of:

sorting names in lexical order;

splitting full names into a hierarchy list and a remainder list, wherein the hierarchy list is stored in a hierarchical list repository entry location and the remainder list is stored in a remainder list repository entry location included in a memory of the general purpose computer processor, wherein duplicate entries are not emitted to the hierarchy list, wherein a flag is emitted to a name list indicating that a next element in the hierarchy list is used, when a full name's hierarchy changes from a preceding name, wherein the name list is stored in a name list repository entry location, also included in the memory and wherein the name list repository entry location is one of a plurality of name list repository entry locations included in the memory;

compressing prefixes of names in the hierarchy list, wherein compressing prefixes is performed by comparing a previous entry to a current entry, wherein a value is emitted indicating the number of equal bytes (k) at the beginning of the string and emitting the remaining string starting at a string beginning +k bytes;

compressing prefixes of names in the name list;

running an output of compressing prefixes of names in the hierarchy list and running an output of compressing prefixes of names in the name list through a compressor software application package, which produces a compressed hierarchy list in conjunction with compressing prefixes of names in the name list; and decompressing names by performing sub operations of:

running the compressed hierarchy list and the name list through a decompressor software application package;

reading a value at a start of an entry;

copying a quantity of bytes from a preceding entry; and appending a string that follows;

setting a pointer at a beginning of the prefix list and setting a pointer at a beginning of the name list;

stepping through the name entries one by one until no names exist, wherein when the flag emitted for the full name's hierarchy changes from the preceding name of the name list is encountered, then the next element in the hierarchy list is used and the prefix pointer is moved forward by one entry; and creating a string pointed to by the prefix pointer and concatenated on to the string pointed to by the name pointer, and creating the full name.

2. The method according to claim 1, wherein, in large models, when the hierarchy list and the remainder list are stored in the hierarchical list repository included in the memory of the general purpose computer processor, speed of decompression is offset by delays incurred in translation misses and page faults due to a smaller size of prefix compressed data.

3. A system of storage management of hierarchical identifiers in simulation models and netlists, the system comprising:
   a computer workstation processor;
   a combination of computer peripheral devices connected to the computer workstation processor,
      where the combination of computer peripheral devices includes a display, a set of input devices including a keyboard and a mouse, an output device, and a network interface,
      wherein the network interface is communicatively connected to a network,
      wherein the network is communicatively connected to a plurality of networked computer devices containing a plurality of storage devices;
   a combination of controllers residing in the computer workstation processor,
      wherein the combination of controllers includes a display controller, a memory controller and an input/output controller;
   a memory, a program unit and an algorithm unit residing in the computer workstation processor,
      wherein the memory contains a hierarchical list repository storing a plurality of lists in a plurality of repository entry locations in the hierarchical list repository;
   the algorithm unit contains a plurality of algorithms and the program unit contains a program that when executed by the computer workstation processor, causes the computer workstation processor to perform operations and sub operations of: compressing names by performing sub operations of:
   sorting names in lexical order;
   splitting full names into a hierarchy list and a remainder lists
      wherein the hierarchy list is stored in a hierarchical list repository entry location and the remainder list is stored in a remainder list repository entry location included in a memory of the general purpose computer processor,
      wherein duplicate entries are not emitted to the hierarchy list,
      wherein a flag is emitted to a name list indicating that a next element in the hierarchy list is used,
      when a full name's hierarchy changes from a preceding name,
      wherein the name list is stored in a name list repository entry location, also included in the memory and
      wherein the name list repository entry location is one of a plurality of name list repository entry locations included in the memory;
   compressing prefixes of names in the hierarchy list,
      wherein compressing prefixes is performed by comparing a previous entry to a current entry,
      wherein a value is emitted indicating the number of equal bytes (k) at the beginning of the string and emitting the remaining string starting at a string beginning +k bytes;
   compressing prefixes of names in the name list;
   running an output of compressing prefixes of names in the hierarchy list and running an output of compressing prefixes of names in the name list through a compressor software application package,
      which produces a compressed hierarchy list in conjunction with compressing prefixes of names in the name list; and
   decompressing names by performing sub operations of:
      running the compressed hierarchy list and the name list through a decompressor software application package;
      reading a value at a start of an entry;
      copying a quantity of bytes from a preceding entry; and appending a string that follows;
      setting a pointer at a beginning of the prefix list and setting a pointer at a beginning of the name list;
      stepping through the name entries one by one until no names exist,
   wherein when the flag emitted for the full name's hierarchy changes from the preceding name of the name list is encountered,
   then the next element in the hierarchy list is used and the prefix pointer is moved forward by one entry; and
      creating a string pointed to by the prefix pointer and concatenated on to the string pointed to by the name pointer, and creating the full name.

4. The system according to claim 3, wherein, in large models, when the hierarchy list and the remainder list are stored in the hierarchical list repository included in the memory of the general purpose computer processor, speed of decompression is offset by delays incurred in translation misses and page faults due to a smaller size of prefix compressed data.

* * * * *